(12) United States Patent
Chen et al.

(10) Patent No.: US 7,402,072 B1
(45) Date of Patent: Jul. 22, 2008

(54) POSITIONING DEVICE FOR FIXING AN INTERFACE CARD ON A COMPUTER CASING WITHOUT USING SCREWS

(75) Inventors: Richard Chen, San Jose, CA (US); Alan Lee, Fremont, CA (US)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/790,086

(22) Filed: Apr. 23, 2007

(51) Int. Cl.
*H01R 13/64* (2006.01)
(52) U.S. Cl. ............ 439/377; 361/801; 312/223.2
(58) Field of Classification Search ......... 439/377; 361/801, 802, 683; 312/222, 223.2
See application file for complete search history.

(56) References Cited

U.S. PATENT DOCUMENTS 5,947,571 A * 9/1999 Ho .................. 312/265.6
7,001,002 B2 * 2/2006 Wei ................. 312/223.2
7,158,385 B1 * 1/2007 Wang ............... 361/759
7,272,016 B2 * 9/2007 Chang .............. 361/801
7,289,318 B2 * 10/2007 Hsiao ............... 361/686

* cited by examiner

*Primary Examiner*—Tho D Ta
(74) *Attorney, Agent, or Firm*—Troxell Law Office, PLLC (57) ABSTRACT

A positioning device for fixing an interface card on a computer casing without using screws, is composed of a vertical wall board of a computer casing, which is provided with long through-holes; fixing seats, which are connected on an interface of the vertical wall board, and are provided with shaft holes and one movable groove; elastic members, which are provided with shaft holes and spring leaves, and are emplaced into the movable grooves; a shaft, which is connected on the fixing seats and the elastic members; and an interface card is provided with a cover, with an end of the cover being provided with an outer board. When the elastic member is subjected to force to rotate, the spring leaf will be abutted on the outer board. When the elastic member rotates reversely, the spring leaf will be escaped from the outer board, and the cover and the interface card can be removed from the vertical wall board simultaneously.

7 Claims, 7 Drawing Sheets

POSITIONING DEVICE FOR FIXING AN INTERFACE CARD ON A COMPUTER CASING WITHOUT USING SCREWS

BACKGROUND OF THE INVENTION a) Field of the Invention

The present invention relates to a positioning device for fixing an interface card on a computer casing without using screws, and more particularly to a positioning device wherein a side board surface of a computer casing is provided with a rotatable elastic member, an inner side of which is provided with a spring leaf that can lock and position a metal cover of an interface card at a vertical board surface of the side board surface, such that the interface card can be fixed on the computer casing horizontally without using screws.

b) Description of the Prior Art

Figure 8:
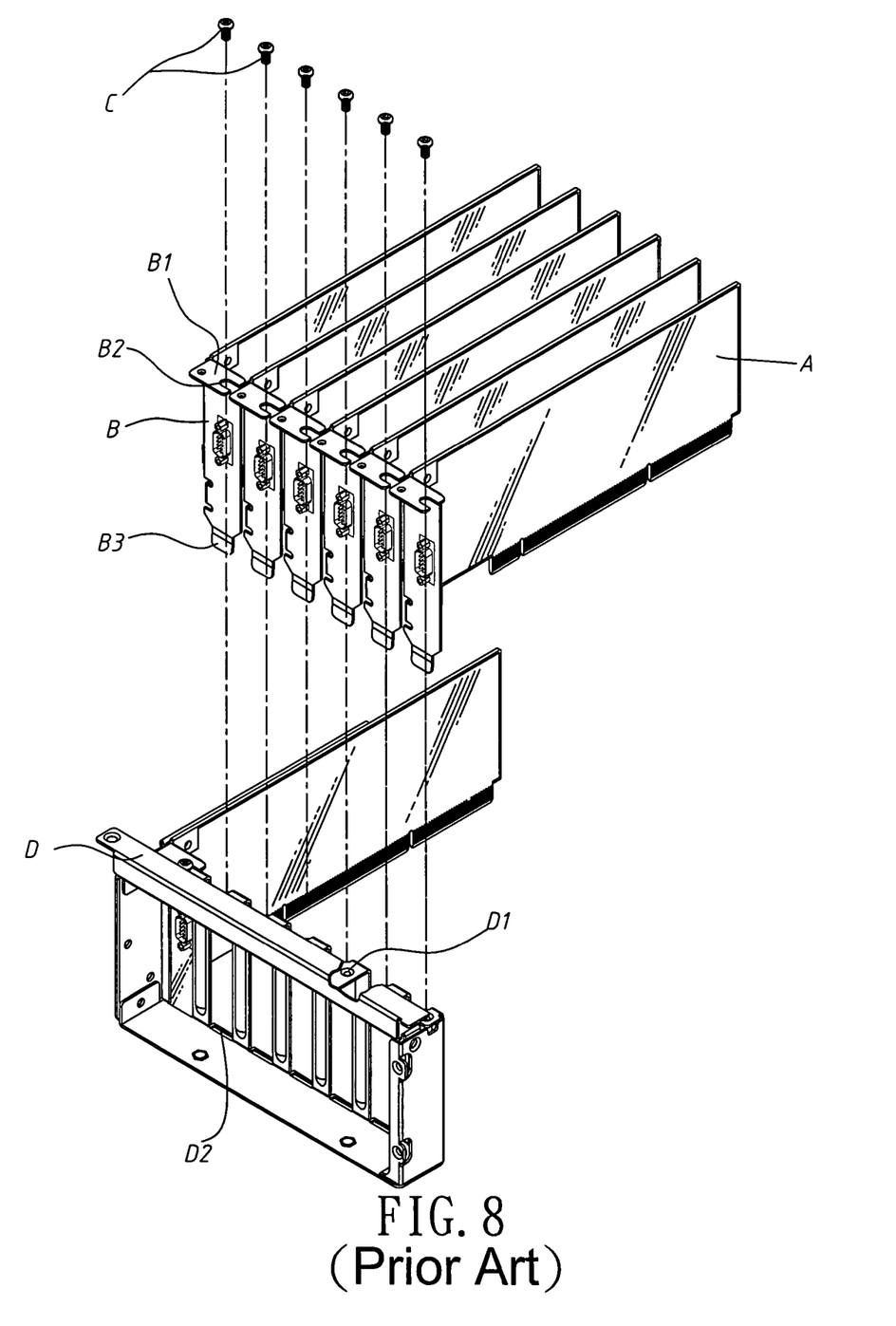
FIG. 8 shows a local exploded view of a conventional interface card which is assembled on a computer casing.

As functions of existing computers are increasing, an interior of a computer casing is inserted with interface cards to enhance the functions of the computer. Referring to FIG. 8, it shows an exploded view of a prior art, wherein a side of an interface card A is connected with an L-shape metal cover B, an end of which is bended by 90° with a positioning plate B1 having a U-shape groove B2; a screw C is screwed into the U-shape groove B2 and a screw-hole D1 of a computer casing D; and an insertion end B3 of the cover B is inserted into a positioning hole D2 of the computer casing D, such that the interface card A can be fixed on the computer casing D. However, the following shortcoming is available upon assembling the interface card A on the computer casing D:

At each time when the interface card A is assembled on or disassemble from the computer casing D, a screw driver has to be used to loosen or tighten the screw C, which is very time consuming in operation, and the screw driver is necessary.

Accordingly, how to eliminate the screwing method described above, and to quickly lock the interface card A on or disassemble the interface card A from the computer casing D, is a technical issue to be pursued by the present invention.

SUMMARY OF THE INVENTION

The primary object of present invention is to provide a positioning device for fixing an interface card on a computer casing without using screws, wherein an elastic member is loosely connected on a shaft, and is provided with a spring leaf. When the elastic member rotates by an angle along the shaft, the spring leaf will lock and position an outer board of a cover, which is bended by 90°, of an interface card, on a side board surface of a computer casing; on the other hand, when the elastic member rotates reversely by an angle along the shaft, the spring leaf will be escaped from the outer board, enabling that the interface card can be quickly disassembled from the computer casing, thereby allowing the interface card to be quickly assembled on and disassembled from the computer casing.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
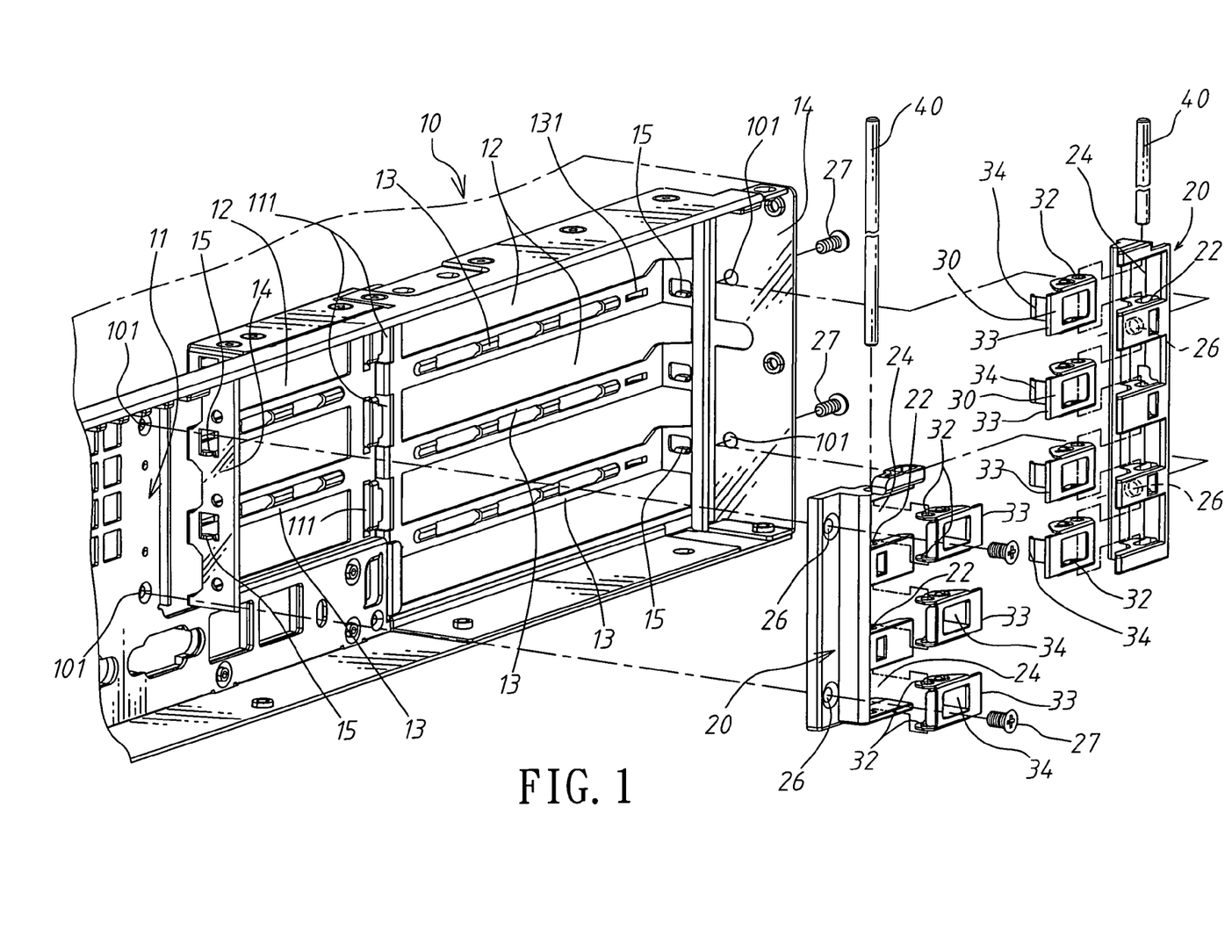
FIG. 1 shows an exploded view of parts of the present invention.
Figure 2:
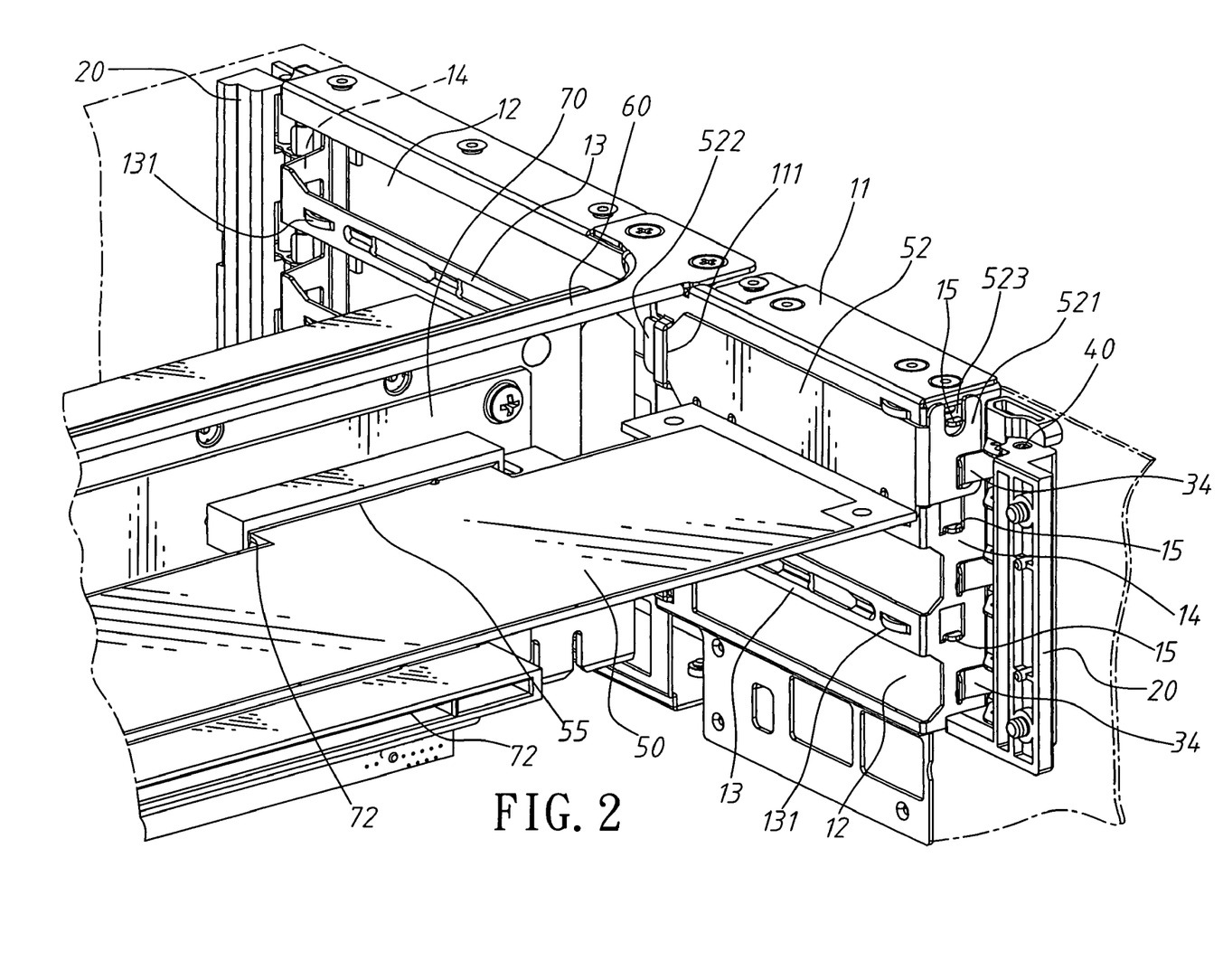
FIG. 2 shows a local perspective view of the present invention after being assembled.

Referring to FIG. 1, the present invention is to provide a positioning device for fixing an interface card on a computer casing without using screws, including a vertical wall board 11 of a computer casing 10, which is provided with at least more than one long through-hole 12, with at least more than one side board surfaces 14 being bended by approximate 90° along a rim of the long through-hole 12; at least more than one fixing seat 20 which is fixedly connected on an interface of the vertical wall board 11, and is provided with a vertical shaft hole 22 and at least more than one movable groove 24; more than one elastic member 30, which is provided with a vertical shaft hole 32 and a projected arc-shape spring leaf 34, and is emplaced into the movable groove 24, with a rear side of the spring leaf 34 being formed with a poking part 33; a shaft 40, which is inserted into the shaft holes 22, 32 for connecting the fixing seats 20 and the elastic members 30, with each elastic member 30 rotating using the shaft 40 as an axis of rotation; and an interface card 50, a side of which is connected with a metal cover 52 (as shown in FIG. 2), with an end of the cover 52 being bended by approximate 90° with an outer board 521, an inner surface of the outer board 521 being abutted on the side board surface 14 of the vertical wall board 11. When the elastic member 30 is subjected to force to rotate, using the shaft 40 as an axis of rotation in the movable groove 24, the spring leaf 34 will be abutted on an outer surface of the outer board 521, such that the outer board 521 can be tightly positioned on a surface of the side board surface 14. On the other hand, when the elastic member 30 is subjected to force to rotate reversely, using the shaft 40 as the axis of rotation in the movable groove 24, the spring leaf 34 will be escaped from the outer board 521, and the cover 52 and the interface card 50 can be removed from the vertical wall board 11 simultaneously.

Referring to FIG. 1 and FIG. 2, an end of the long through-hole 12 is provided with an insertion hole 111, and an end of the cover 52 is provided with an insertion part 522 which can be inserted into the insertion hole 111, such that the cover 52 can be stably positioned on the vertical wall board 11.

Referring to FIG. 2, the outer board 521 of the cover 52 is provided with a U-shape groove 523, and the side board surface 14 is provided respectively with more than one projection piece 15 which is protruded out of the U-shape groove 523 to prevent the outer board 521 from sliding and dislocating.

Referring to FIG. 2, a vertical bracket 60 is extended along an inner side of the vertical wall board 11, and at least one side of the vertical bracket 60 is fixedly connected with a vertical circuit board 70 which is transversally provided with more than one slot 72. A conduction pin 55 of the interface card 50 is inserted into the slot 72, and the interface card 50 is stably positioned at an interface between the vertical wall board 11 and the vertical bracket 60.

Figure 5:
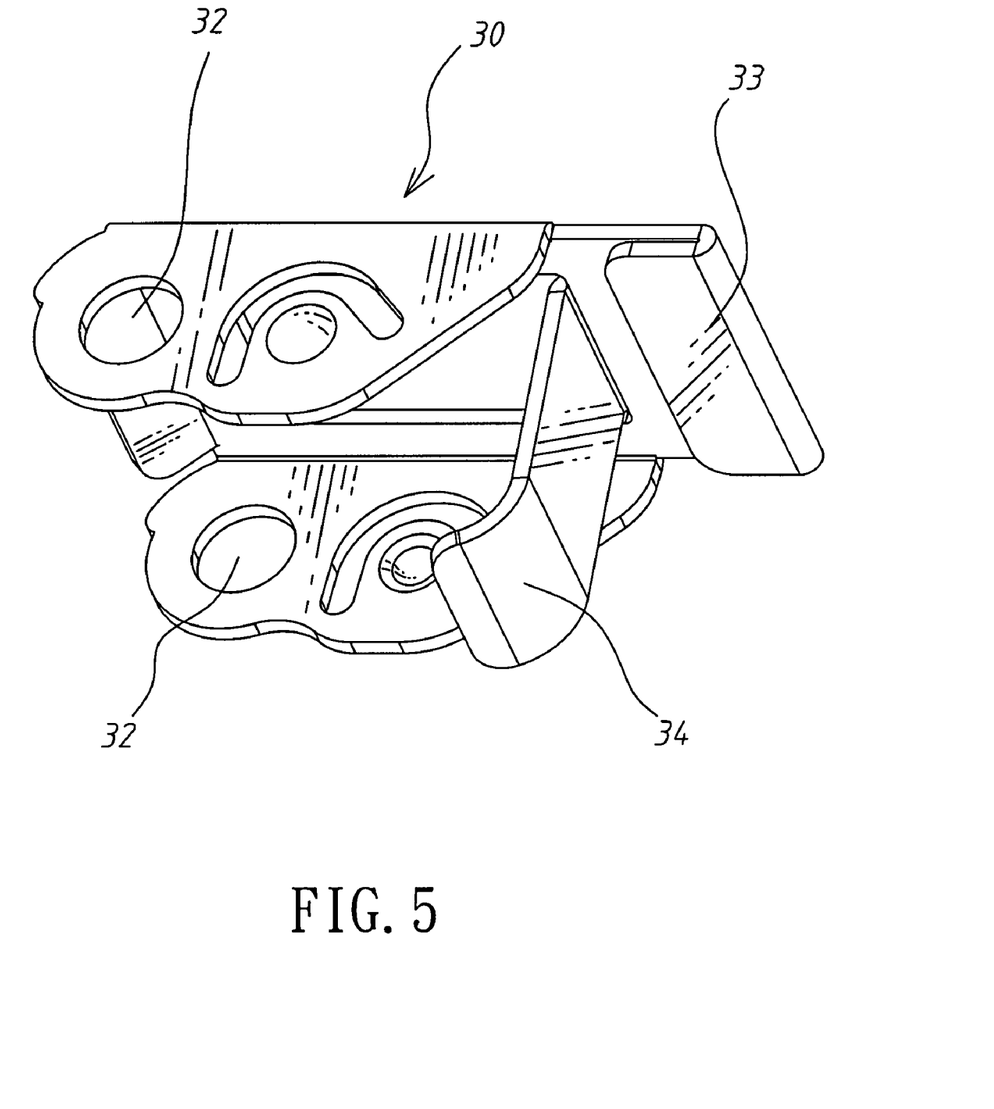
FIG. 5 shows a perspective view of an elastic member of the present invention.
Figure 6:
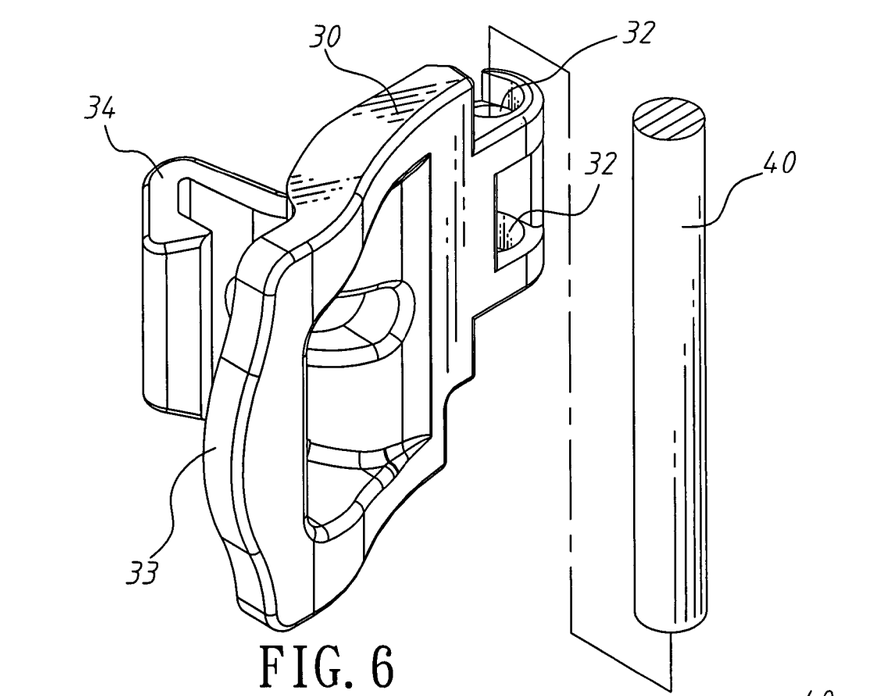
FIG. 6 shows a perspective view of another embodiment of an elastic member of the present invention.
Figure 7:
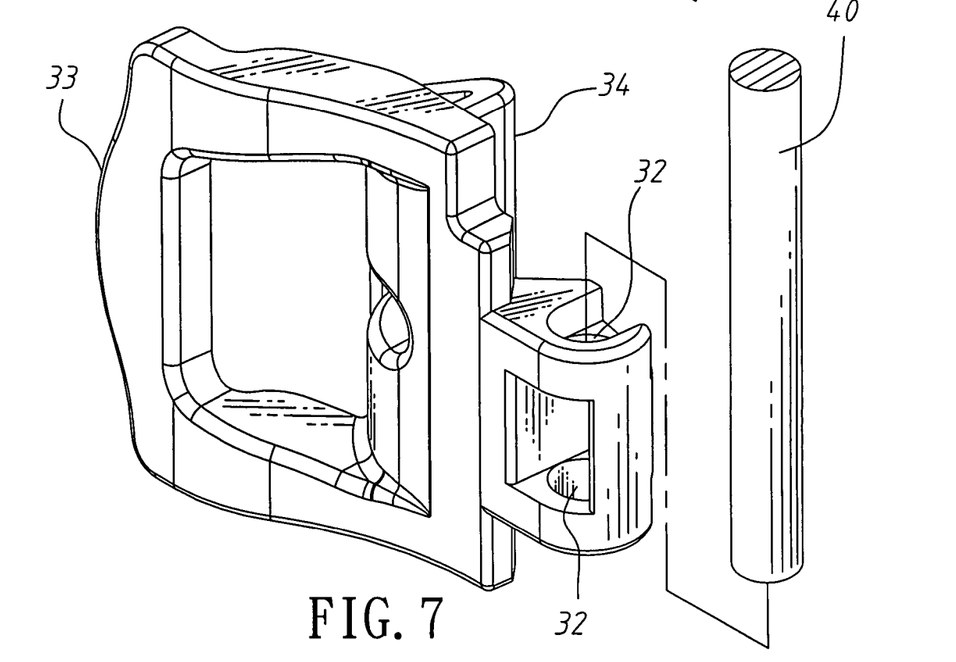
FIG. 7 shows another perspective view of another embodiment of an elastic member of the present invention.

Referring to FIGS. 5 to 7, the spring leaf 34 and the elastic member 30 are formed integrally, the poking part 33 is a place to be subjected to force by a human finger, and the elastic member 30 can be made by metal or plastic.

Figure 3:
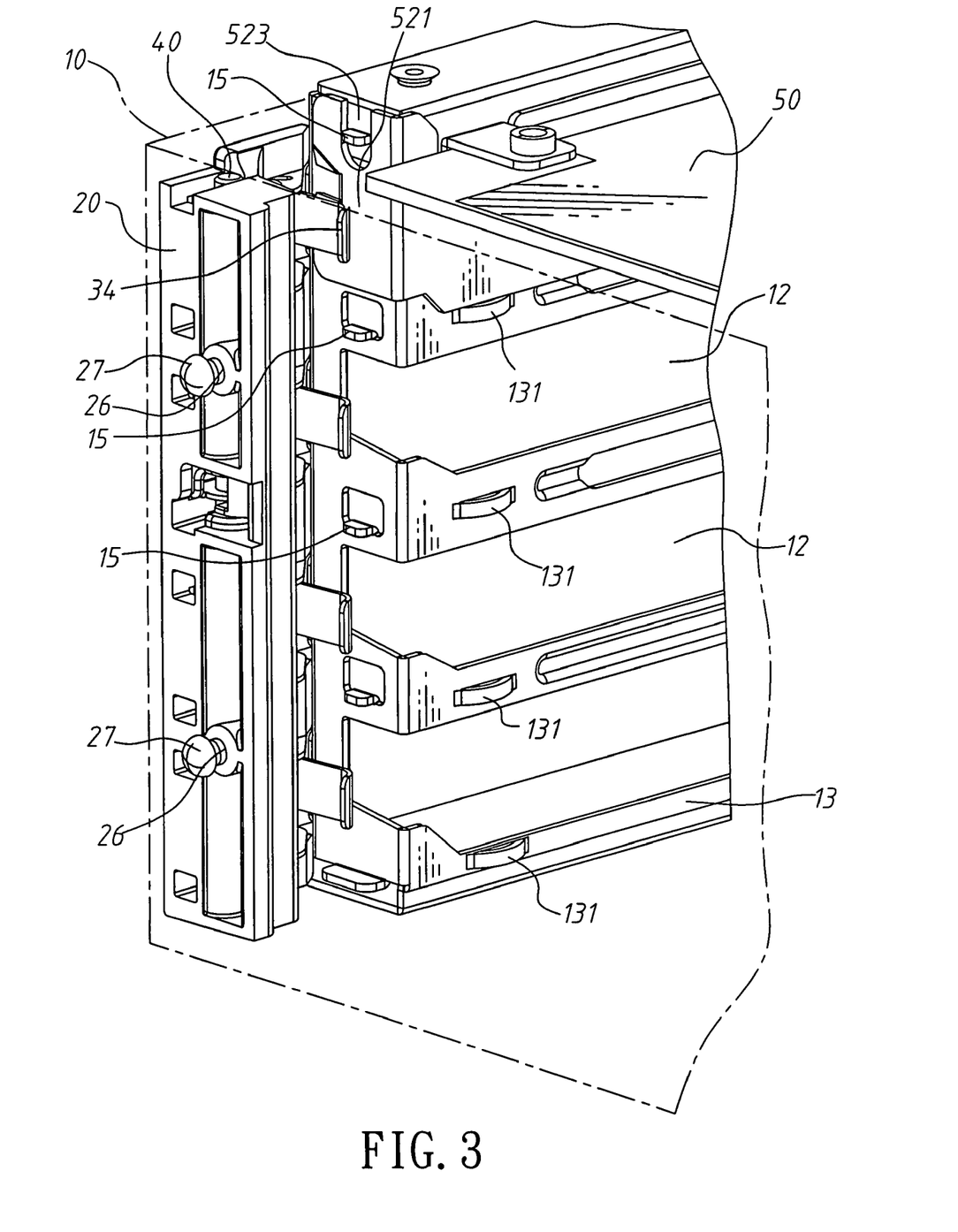
FIG. 3 shows another local perspective view of the present invention after being assembled.

Referring to FIG. 3, a long strip 13 is located between any two neighboring long through-holes 12, and an outer surface of each long strip 13 is provided with a projected arc part 131.

Referring to FIG. 1, the fixing seat 20 is provided with a connection hole 26, and a bolt 27 is screwed into a preset screw-hole 101 of the computer casing 10 and the connection hole 26, in order to fix the fixing seat 20 on the vertical wall board 11.

Referring to FIG. 6 and FIG. 7, it shows another embodiment of the elastic member 30 which is made by plastic, according to the present invention. Its entire shape and function are all the same as those of the elastic member 30 as shown in FIG. 1 and FIG. 2; that is, it is also provided with the spring leaf 34, and the spring leaf 34 is formed integrally with the elastic member 30, thereby being provided well with elasticity upon being subjected to force. The poking part 33 provides for a poking operation by the human finger, the shaft hole 22 provides for a transfixing of the shaft 40, and the spring leaf 34 can also tightly position the outer board 521 on the side board surface 14.

Referring to FIG. 1, a vertical wall board 11 is a side wall of a computer casing 10, and can serve as an I/O interface. In a preferred embodiment of the present invention, left and right sides to the vertical wall board 11 are fixed respectively with vertical fixing seats 20, and a plurality of elastic members 30 is loosely connected into a movable groove 24 of the fixing seat 20 by a shaft 40, respectively. Referring to FIG. 2, at least one side to a vertical circuit board 70 is provided with respectively with slots 72 of various sizes, and the circuit board 70 is fixed on a vertical bracket 60.

Figure 4:
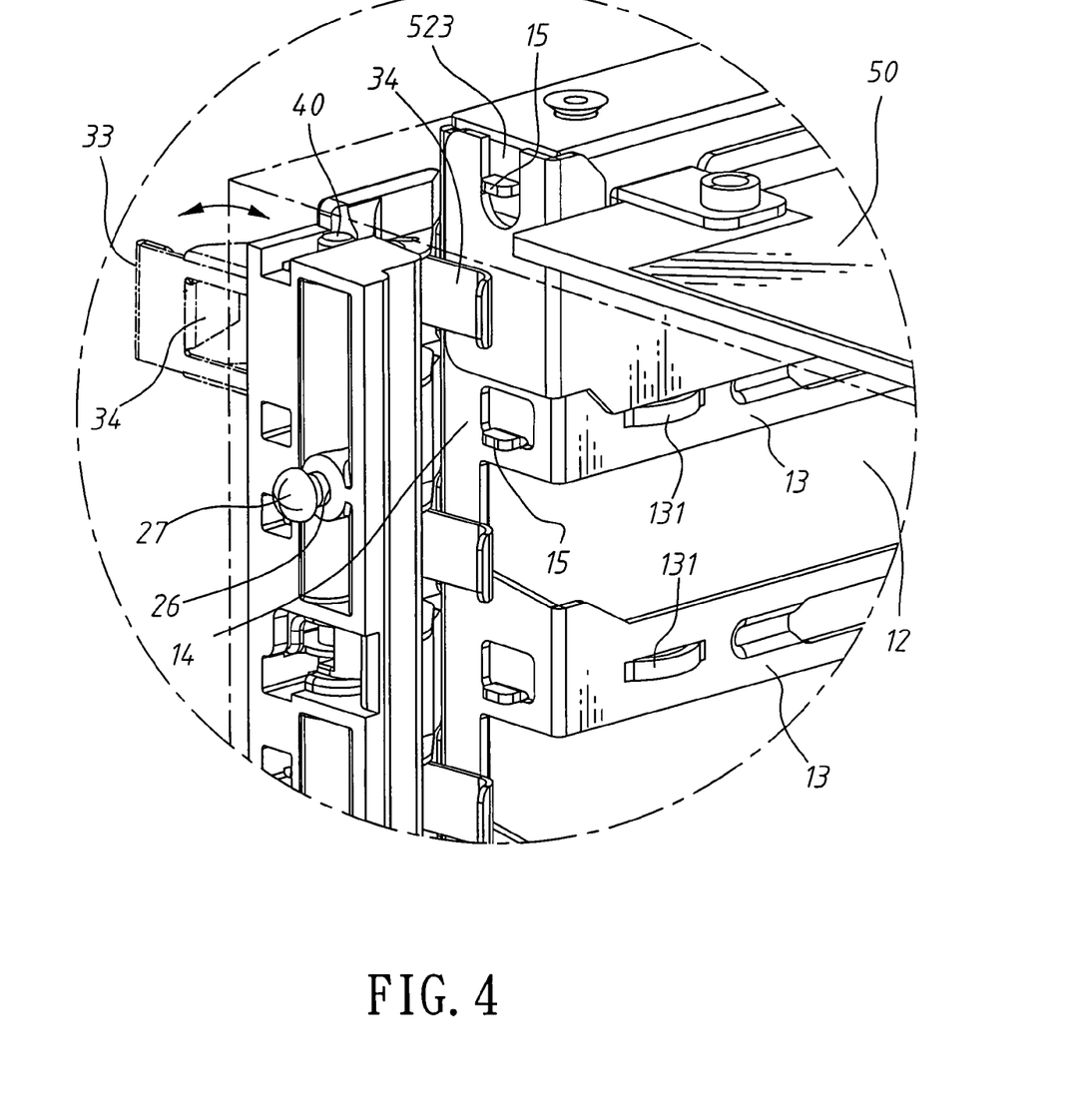
FIG. 4 shows a local perspective view of the present invention upon being assembled.

A conduction pin 55 for electrical connection, of at least more than one interface card 50 which can be a data card of all kinds of additive functions, is inserted into the slot 72; a cover 52 which is connected at an exterior end of the interface card 50, is inserted into an insertion hole 111 through an insertion part 522; and then an outer board 521 is abutted on a side board surface 14. A poking part 33 (as shown in FIG. 4) is operated by a human finger, which enables the entire elastic member 30 to rotate counterclockwise by an angle with the shaft 40 as a center of axis. A spring leaf 34 is then deformed elastically by being subjected to force, and is abutted on the outer board 521 which is locked and tightly positioned on the side board surface 14. Therefore, the entire interface card 50 is stably positioned on an interface between the vertical wall board 11 and the circuit board 70 horizontally. This operation is performed without using a bolt for screwing as in a prior art, at all.

When the interface card 50 is to be disassembled from the circuit board 70 and the vertical wall board 11, the poking part 33 (as shown in FIG. 4) is operated by the finger, enabling the entire elastic member 30 to rotate clockwise by an angle with the shaft 40 as the center of axis. Then, the spring leaf 34 will be frictionally dislocated on the outer board 521, and will be elastically restored immediately, upon being escaped from the outer board 521. As the force of the spring leaf 34 that is pressed on the outer board 521 has disappeared, the entire interface card 50 and the cover 52 can be removed easily, and the insertion part 522 can be withdrawn from the insertion hole 111. This operation is performed without using a screw drive for releasing a bolt as in a prior art, at all.

Referring to FIGS. 2 to 4, a projection piece 15 is horizontally located in a U-shape groove 523 to prevent the outer board 521 from sliding and dislocating. A long strip 13 is provided between any two neighboring long through-holes 12. A surface of an outer end of each long strip 13 is formed with a projected arc part 131, and the cover 52 is exactly located between the two neighboring projected arc parts 131. The two projected arc parts 131 are blocked at a lower edge and an upper edge of the cover 52 to prevent the cover 52 from sliding and dislocating upward and downward.

Accordingly, the present invention allows the interface card to be fixedly connected and positioned on the computer casing, without using the screw driver and the bolts at all, thereby enabling the interface card to be more quickly and conveniently assembled on or disassembled from the computer casing.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A positioning device for fixing an interface card on a computer casing without using screws:

a vertical wall board of a computer casing, which is provided with at least more than one long through-holes, with more than one side board surface being bended by approximate 90° along a rim of the long through-hole; at least more than one fixing seat which is fixedly connected on an interface of the vertical wall board, and is provided with a vertical shaft hole and at least more than one movable groove; more than one elastic member which is provided with a vertical shaft hole and a projected arc-shape spring leaf being emplaced into the movable groove, with a rear side of the spring leaf being formed with a poking part; a shaft, which is inserted into the shaft holes for connecting the fixing seats and the elastic members, with each of the elastic member rotating with the shaft as an axis of rotation; and an interface card, a side of which is connected with a metal cover; and an end of the cover being bended by approximate 90° with an outer board, and an inner surface of the outer board being abutted on the side board surface of the vertical wall board; the elastic member being subjected to force to rotate with the shaft as the axis of rotation, and the spring leaf being abutted on an outer surface of the outer board, such that the outer board is tightly positioned on a surface of the side board surface; on the other hand, the elastic member being subjected to force to rotate reversely with the shaft as the axis of rotation, and the spring leaf being escaped from the outer board, such that the cover and the interface card are removed from the vertical wall board simultaneously.

2. The positioning device for fixing an interface card on a computer casing without using screws, according to claim 1, wherein an end of the long through-hole is provided with an insertion hole, and an end of the cover is provided with an insertion part which is inserted into the insertion hole, such that the cover is stably positioned on the vertical wall board.

3. The positioning device for fixing an interface card on a computer casing without using screws, according to claim 1, wherein the outer board of the cover is provided with a U-shape groove, and the side board surface is provided respectively with at least more than one projection piece which is protruded out of the U-shape groove to prevent the outer board from sliding and dislocating.

4. The positioning device for fixing an interface card on a computer casing without using screws, according to claim 1, wherein a vertical bracket is extended along an inner side of the vertical wall board, and at least one side of the vertical bracket is fixedly connected with a vertical circuit board which is transversally provided with at least more than one slot; a conduction pin of the interface card being inserted into the slot, and the interface card being stably positioned at an interface between the vertical wall board and the vertical bracket.

5. The positioning device for fixing an interface card on a computer casing without using screws, according to claim 1, wherein the spring leaf and the elastic member are formed integrally, the poking part is a place to be subjected to force by a human finger, and the elastic member is made by metal or plastic.

6. The positioning device for fixing an interface card on a computer casing without using screws, according to claim 1, wherein a long strip is located between any two neighboring long through-holes and an outer surface of each long strip is protruded with a projected arc part.

7. The positioning device for fixing an interface card on a computer casing without using screws, according to claim 1, wherein the fixing seat is provided with a connection hole, and a bolt is screwed into a preset screw-hole of the computer casing and the connection hole to fix the fixing seat on the vertical wall board.

* * * * *